(12) United States Patent
Ciucivara et al.

(10) Patent No.: US 9,746,577 B2
(45) Date of Patent: Aug. 29, 2017

(54) UNCERTAINTY ESTIMATION OF SUBSURFACE RESISTIVITY SOLUTIONS

(71) Applicants: Adrian Ciucivara, Houston, TX (US); Dennis E. Willen, Houston, TX (US)

(72) Inventors: Adrian Ciucivara, Houston, TX (US); Dennis E. Willen, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 685 days.

(21) Appl. No.: 14/271,131

(22) Filed: May 6, 2014

(65) Prior Publication Data

US 2014/0358503 A1 Dec. 4, 2014

Related U.S. Application Data

(60) Provisional application No. 61/830,539, filed on Jun. 3, 2013.

(51) Int. Cl.
| | |
|---|---|
| *G06F 7/60* | (2006.01) |
| *G06F 17/10* | (2006.01) |
| *G01V 3/38* | (2006.01) |
| *G06F 17/50* | (2006.01) |

(52) U.S. Cl.
CPC .......... *G01V 3/38* (2013.01); *G01V 2210/62* (2013.01); *G06F 17/50* (2013.01)

(58) Field of Classification Search
None
See application file for complete search history.

(56) References Cited

U.S. PATENT DOCUMENTS

| | | |
|---|---|---|
| 6,549,854 B1 | 4/2003 | Malinverno et al. |
| 6,739,165 B1 | 5/2004 | Strack |
| 6,859,038 B2 | 2/2005 | Ellingsrud et al. |
| 6,950,747 B2 | 9/2005 | Byerly |
| 6,999,880 B2 | 2/2006 | Lee |

(Continued)

FOREIGN PATENT DOCUMENTS

| | | |
|---|---|---|
| WO | WO 2009/006464 | 1/2009 |
| WO | WO 2011/115921 | 9/2011 |
| WO | WO 2011/159255 | 12/2011 |

OTHER PUBLICATIONS

Zach, J.J. et al., "3D Inversion-Based Interpretation of Marine CSEM Data", May 4-7, 2009, Offshore Technical Conference.*

(Continued)

*Primary Examiner* — Cedric D Johnson
(74) *Attorney, Agent, or Firm* — ExxonMobil Upstream Research-Law Department

(57) ABSTRACT

Method for estimating uncertainty in a physical property model generated by inverting measured geophysical data, for example, a resistivity model inferred from electromagnetic field data. The method involves as few as one data inversion coupled with a number of forward simulation. Alternative solutions (models) are generated by probing a perturbation space defined from a reduced model space, resulting from a principal component decomposition of the inverted model, and selecting some of the larger components. Statistical analysis techniques may be applied (to those alternative solutions remaining after thresholding) to generate quantitative uncertainty estimates applicable to the inverted model.

13 Claims, 2 Drawing Sheets

(56) References Cited

U.S. PATENT DOCUMENTS

| | | |
|---|---|---|
| 7,145,341 B2 | 12/2006 | Ellingsrud et al. |
| 7,187,569 B2 | 3/2007 | Sinha et al. |
| 7,191,063 B2 | 3/2007 | Tompkins |
| 7,356,412 B2 | 4/2008 | Tompkins |
| 7,362,102 B2 | 4/2008 | Andreis |
| 7,542,851 B2 | 6/2009 | Tompkins |
| 7,659,721 B2 | 2/2010 | MacGregor et al. |
| 7,667,464 B2 | 2/2010 | Campbell |
| 7,683,625 B2 | 3/2010 | Milne et al. |
| 8,095,345 B2 | 1/2012 | Hoversten |
| 8,099,239 B2 | 1/2012 | MacGregor et al. |
| 2003/0220739 A1* | 11/2003 | Feldman ............ G01V 7/06 702/2 |
| 2006/0186887 A1 | 8/2006 | Strack et al. |
| 2009/0134877 A1 | 5/2009 | Schaug-Pettersen |
| 2011/0264421 A1 | 10/2011 | Jing et al. |
| 2011/0307438 A1* | 12/2011 | Fernandez ............ G06N 7/005 706/52 |

OTHER PUBLICATIONS

Malik, Mayank et al., "A Dual-Grid Automatic-History-Matching Technique with Applications to 3D Formation Testing in the Presence of Oil-Based-Mud-Filtrate Invasion", Mar. 2009, SPE Journal, Society of Petroleum Engineers.*

Rabinovich, M. et al., "Multi-Component Induction Logging: 10 Years After", Jun. 3-6, 2007, SPWLA 48th Annual Logging Symposium, Society of Petrophysicists and Well Log Analysts (SPWLA).*

Tompkins, Michael J. et al., "Marine Electromagnetic Inverse Solution Appraisal and Uncertainty Using Model-Derived Basis Functions and Sparse Geometric Sampling", Feb. 2011, Geophysical Prospecting, 59, European Association of Geoscientists & Engineers.*

Tompkins, Michael J. et al., "Comparison of Sparse Grid Geometric and Random Sampling Methods in Non-Linear Inverse Solution Uncertainty Estimation", Jan. 2013, Geophysical Prospecting, Research Gate.*

Anandaroop, R. et al. (2012), "Bayesian inversion of marine CSEM data with a trans-dimensional self parametrizing algorithm," *Geophysical Journal Int'l.* 191(3), pp. 1135-1151.

Tompkins, J. et a. (2011), "Scalable uncertainty estimation of nonlinear inverse problems using parameter reduction, constraint mapping, and geometric sampling: Marine controlled-source electromagnetic examples," *Geophysics* 76(4), pp. F263-F281.

Alumbaugh, D.L. et al. (2000), "Image appraisal for 2-D and 3-D electromagnetic inversion," *Geophysics* 65(5), pp. 1455-1467.

Sen, M.K. et al. (1996), "Bayesian inference, Gibbs' sampler and uncertainty estimation in geophysical inversion, " *Geophysical Prospecting* 44, pp. 313-350.

Tompkins, M.J. et al. (2011), "Marine electromagnetic inverse solution appraisal and uncertainty using model-derived basis functions and sparse geometic sampling," *Geophysical Prospecting* 59, pp. 947-965.

Vasilescu, M.A. et al. (2002), "Multilinear Analysis of Image Ensemles: TensorFaces," *Computer Vision—ECCV*, Springer, pp. 447-460.

\* cited by examiner

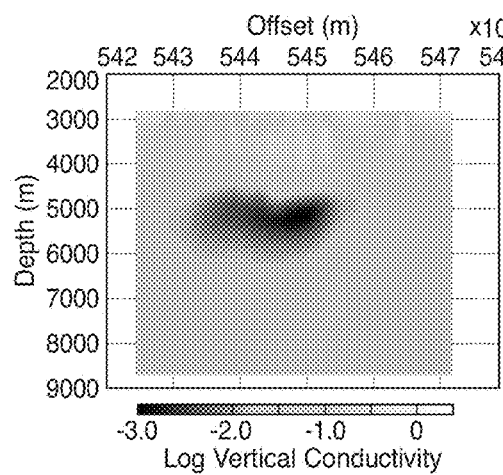
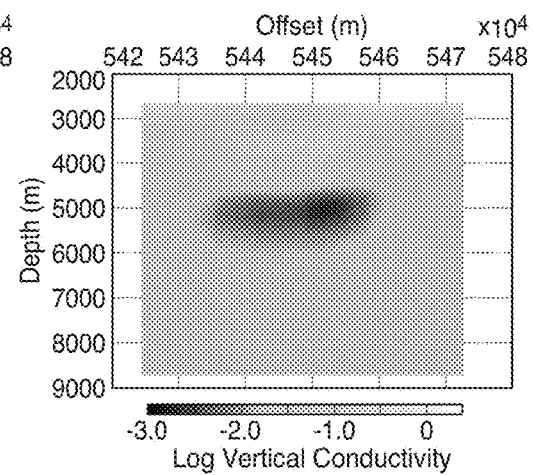
FIG. 1A    FIG. 1B
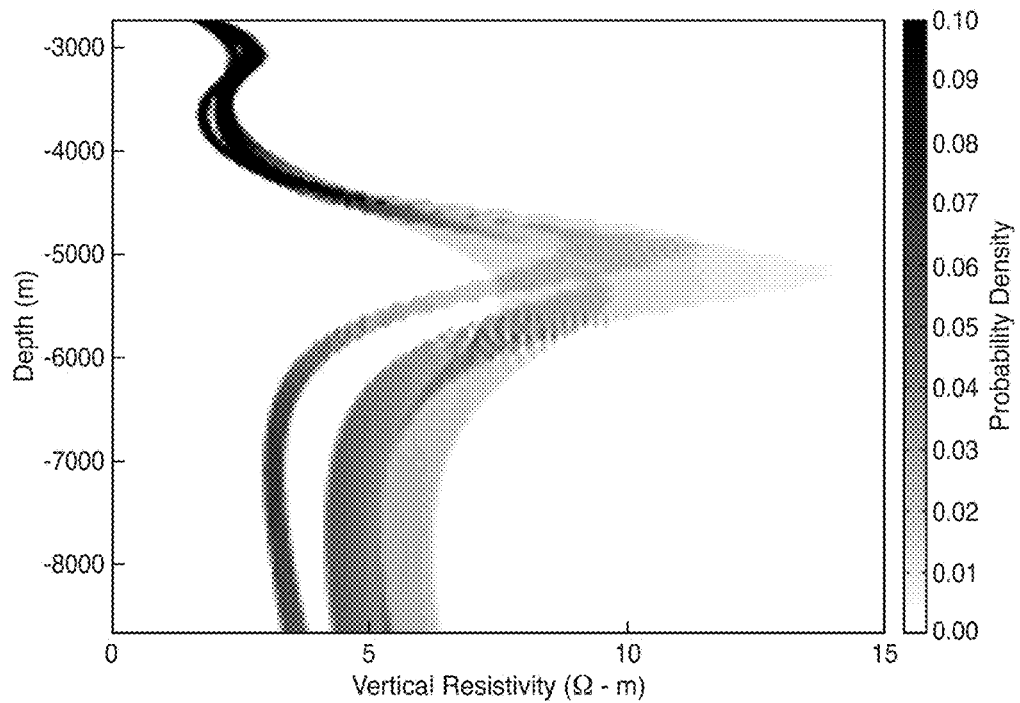
FIG. 2

UNCERTAINTY ESTIMATION OF SUBSURFACE RESISTIVITY SOLUTIONS

CROSS-REFERENCE TO RELATED APPLICATION

This application claims the benefit of U.S. Provisional Patent Application 61/830,539, filed Jun. 3, 2013, entitled "Uncertainty Estimation of Subsurface Resistivity Solutions," the entirety of which is incorporated by reference herein.

FIELD OF THE INVENTION

This invention relates generally to the field of geophysical prospecting for hydrocarbons and, more particularly, to electromagnetic prospecting. Specifically, the invention is a method for estimating uncertainty in resistivity models inverted from electromagnetic data.

BACKGROUND OF THE INVENTION

Subsurface resistivities from anisotropic inversions of electromagnetic data provide quantitative input to hydrocarbon exploration decisions, and it is therefore desirable to have quantitative estimates of the uncertainties associated with those resistivities. Due to the geologic complexity of the subsurface, these resistivities are most accurately determined as three-dimensional models that also capture the effects of anisotropy. In addition to the severe computational burden of working with three-dimensional models and datasets, the quantitative estimation of resistivity uncertainty is hampered by the non-linearity of the inversion process, noisy data, limited bandwidth, and the need to regularize what is otherwise an underdetermined inversion problem. It is desirable to have a method of estimating resistivity uncertainties that can be applied to three-dimensional problems at reasonable computational cost.

There have been two conventional approaches to this problem. The first is to carry out a limited number of sensitivity tests aimed at exposing those features of the subsurface which are most (or least) reliably determined by the data and the inversion process. For example, 3D inversions might be carried out from different starting models or with different degrees of regularization.

The disadvantages of this approach are that it is limited by the number of 3D inversions that can be carried out, relies on somehow identifying the most important sources of uncertainty in a particular problem, and provides only a qualitative view of uncertainty. Occasionally, in an attempt to get a more quantitative description, linearized estimates of the uncertainty are calculated by computing model resolution and covariance matrices; see Alumbaugh and Newman, "Image appraisal for 2-D and 3-D electromagnetic inversion," (Geophysics 65, 1455-1467 (2000). Although the linearized uncertainty may prove useful for weakly nonlinear problems, one could expect a severe underestimation of the uncertainty model for most of the electromagnetic problems (which are usually highly nonlinear).

The second approach is to approximate the problem, usually by assuming the earth to be one-dimensional, so that the underlying computations become much faster and simpler. This approximation allows for either very large numbers of inversions (deterministic approach) or forward modeling (stochastic approach) to be carried out in an attempt to ensure that important sources of uncertainty are not missed. See "Bayesian inference, Gibbs' sampler and uncertainty estimation in geophysical inversion," Sen and Stoffa, Geophysical Prospecting 44, 313-350 (1996). While this approach does result in quantitative estimates of uncertainty, the assumption that the earth is laterally invariant strongly limits the value of those estimates.

In an attempt to overcome the deficiencies associated with the two conventional approaches discussed above, Tompkins et al. ("Marine electromagnetic inverse solution appraisal and uncertainty using model-derived basis functions and sparse geometric sampling," Geophysical Prospecting 59, 947-965 (2011)) suggested a coarser parameterization in a reduced model space defined by means of optimization. This novel approach combines the power of the full 3D anisotropic optimization with a stochastic posterior analysis in a reduced—and therefore tractable—model space. The concept of the reduced model space along with the hybrid nature of the method (both full 3D and stochastic) makes this approach distinctively different from the other two discussed above.

SUMMARY OF THE INVENTION

In one embodiment, the invention is a computer-implemented method for quantitatively estimating uncertainty in a model of a subsurface physical property inferred by inversion of measured geophysical data, comprising: (a) performing a principal component decomposition of the model by transforming the model to a principal component domain; (b) reducing the principal component domain to an N-dimensional reduced domain by selecting N, less than all, of the principal components, based on a criterion favoring large principal components over small principal components; (c) defining an D-dimensional perturbation space within the reduced domain, where D<N; (d) generating one or more perturbed models by perturbing the model within the perturbation space; and (e) applying a statistical analysis technique to some or all of the one or more perturbed models to compute the uncertainty in said model inferred by inversion of measured geophysical data, or compute a statistically updated model and associated uncertainty.

Interpolation between models in the perturbation space may be used to generate additional perturbed models.

The geophysical data may be electromagnetic data, and the subsurface physical property may be resistivity. The subsurface may be treated as anisotropic, for example characterized by a horizontal resistivity and a vertical resistivity. The inversion may update both horizontal and vertical resistivity, and both models may be perturbed simultaneously in a joint perturbation space.

BRIEF DESCRIPTION OF THE DRAWINGS

The advantages of the present invention are better understood by referring to the following detailed description and the attached drawings, in which:

FIG. 1A shows a vertical slice through a resistivity solution cube obtained from inversion of electromagnetic data, and FIG. 1B shows a vertical slice of the same resistivity solution cube obtained after filtering out all but the four largest principle components;

FIG. 2 shows probability density (PD) of vertical resistivity extracted at a single surface location built by considering perturbations around the solutions obtained from inverting 3 different starting models; the horizontal axis is resistivity and the vertical axis is depth.

Figure 3:
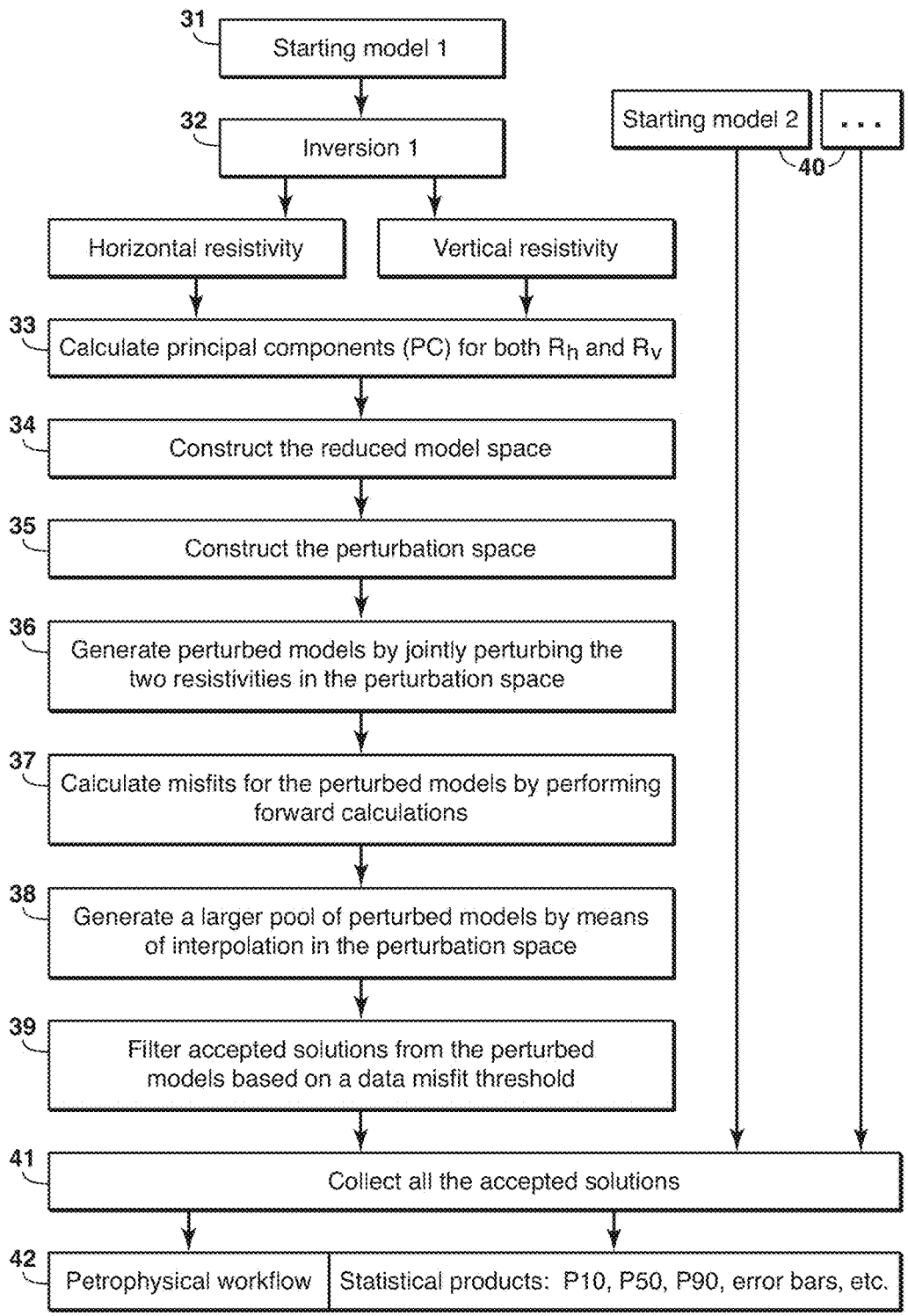
FIG. 3 is a flowchart showing basic steps in one embodiment of the present inventive method.

The invention will be described in connection with example embodiments. However, to the extent that the following detailed description is specific to a particular embodiment or a particular use of the invention, this is intended to be illustrative only, and is not to be construed as limiting the scope of the invention. On the contrary, it is intended to cover all alternatives, modifications and equivalents that may be included within the scope of the invention, as defined by the appended claims.

DETAILED DESCRIPTION OF EXAMPLE EMBODIMENTS

The present inventive method is based on some concepts in the above described paper by Tompkins et al., but with significant differences in the implementation of different steps in the workflow. It involves a posterior probability analysis of a given resistivity solution model, likely obtained as a result of an inversion process but not necessarily limited to that. Furthermore, the method involves reducing the parameterization of the given 3D resistivity model by exploring the space of the principal components ("PC Space") and retaining only a small and relevant subset of those components. The transform of the resistivity model to the PC space may be carried out using a tensorial decomposition method; see Vasilescu and Terzopoulos, "Multilinear analysis of image ensembles: Tensorfaces," *Computer Vision—ECCV* 2002, Springer, 447-460 (2002), which is a generalization for the 3D case of the more familiar singular value decomposition or SVD technique. Persons who work in the technical field will know of other ways to do principal value or similar decompositions.

The goal is to probe the solution space by generating perturbations to the given 3D solution model, but instead of doing it in the direct model space (which is at best impractical, and more likely intractable), this is done in the reduced model space of the relevant PC's in an organized fashion. The advantage is substantial. Instead of perturbing the model cell by cell (the size of a realistic model can be on the order of $10^8$ cells), the perturbations may be limited to the relevant characteristics (moments) of the solution which are captured by the few PC's that form the reduced model space. This translates into a manageable number of perturbations of the principle components, each of those corresponding to a new model in the direct model space. The newly generated models that prove to be consistent with the data (tested by means of forward modeling) become themselves solutions to the inversion problem.

In some of its embodiments, the present inventive method uses only one inversion and a limited number of forward modeling runs. This approach frees up computational time and allows estimating the impact of nonlinearity using additional 3D inversions. The minimum number of principal components needed to reconstruct an image will differ based on the complexity of the image. Low resolution images (large spatial wavelengths) need fewer PC's than high resolution, rapidly spatially varying images. That means that the number of PC's needed to be considered depends on both the data and the inverted solution. When one considers anisotropy, any given solution consists of two resistivity cubes representing the horizontal and the vertical resistivity. Thus, the same analysis could be carried out separately for the horizontal resistivity and for the vertical resistivity, or, the two resistivity cubes can be treated together as one anisotropic solution. This makes the reduced space a direct product between the reduced spaces of horizontal resistivity and the reduced spaces of vertical resistivity. However, because of the low resolution of the electromagnetic methods, a few of these PC's suffice to capture the characteristics of a given solution. This is illustrated in FIGS. 1A-1B, where a fairly good image of the vertical resistivity model that is shown in FIG. 1A, was constructed (FIG. 1B) by keeping only the 4 largest PC's of the image of the original model. Once the reduced space is determined, one can think about ways to explore the solution more efficiently in this reduced space.

One approach (suggested by Tompkins et. al.) is to perturb each PC from the reduced model space around its nonperturbed value, take all possible combinations of those perturbations (or just a subset based on some selection/weighting scheme) and reassemble the perturbed images. The process generates a set of perturbed models which are subject to an acceptance/rejection selection step based on the individual data misfits obtained from forward simulations. All the accepted models are considered equivalent solutions and generate the solution space.

The approach in the present invention is different. Due to the smooth nature of the CSEM derived resistivity solutions, a large fraction of its energy is captured in the first PC. This looks like a smooth version of the solution and generally captures most of the background resistivity plus a faded version of the resistivity anomaly. The subsequent PC's from the reduced space capture more details about the image in general and build up the anomaly in particular. Even though each subsequent component adds characteristics to the anomaly, experience has shown that it is advantageous to consider the largest component by itself, but consider the accumulated contribution of several of the largest components (apart from the largest one) taken together, to recover the character of the anomaly. Following this observation, the present invention performs the perturbation in a different way by defining a perturbation space constructed from the reduced space. Next, this is explained in more detail.

First, the reduced space spanned by the space of the relevant principal components is constructed. The number of relevant components is problem dependent and depends on how fast the image is reconstructed as a result of adding more PC's (convergence). The faster the convergence, the fewer PC's are needed. The number of PC's considered can be decided by inspection or by asking to reconstruct the image up to an image reconstruction energy threshold (e.g., 98%). In the present invention's approach, as opposed to Tompkins, the number of PC's considered to be in the reduced space do not add computation overhead because the perturbations are not done in the reduced space, but rather in a perturbation space that will be discussed next. Nevertheless, it is preferable that only the relatively more relevant characteristics of the image are captured by the PC's that form the reduced space. The reason for this is to avoid projecting into the reduced space undesirable features generated by noisy data, numerical noise, survey overprint or other artifacts that are usually captured by higher order components.

Once the reduced space is defined, a 2-dimensional perturbation space (D=2) may be defined, in which the first dimension is spanned by the largest PC while the second dimension is given by the subspace of the next m relevant PC's. Assuming that N is the dimension of the reduced space, m can take any value from 1 to N−1, but a preferable value may be m=N−1, so the second dimension of the perturbation space spans all of the rest of the reduced space. Next, the projection of the solutions in the reduced space is perturbed along the 2 vectors that span the perturbation space. It is preferable to consider at least 2 perturbations around the unperturbed value along each of the two dimensions. Thus, if there are M−1 perturbations along each dimension, this will result in $M^D$ perturbed models (this number also includes instances for which the solution remains unperturbed along one or both dimensions of the perturbation space). After the perturbed models are generated, individual data misfits are calculated by means of forward simulations. As a result, each perturbed model will be paired up with its corresponding data misfit.

One can imagine a higher order perturbation space (D>2) where the PC's are grouped in a different way that better probes a particular solution space. One example would be a perturbation space with D=3 where the first 2 dimension are chosen on the way described above, while the $3^{rd}$ dimension locks on a group of higher order PC's that may describe more subtle characteristics of the anomaly.

A somewhat different variant of the perturbation space, which can be useful in the case of spatially confined anomalies, emerges by combining the method described above with the use of spatially restricted 3D windows for either calculating the PC's or performing the perturbations or both (e.g., zooming in on the anomaly).

A D-dimensional interpolation may then be performed in order to get a denser grid of perturbed models and their misfits. (D is the dimension of the perturbation space).

Provided that the perturbation was done in a sensible manner, i.e. the minimum of the objective function is sampled in the vicinity of a particular solution, a good fraction of these models (perturbed solutions) resulting from perturbing the original solution (generated by inversion) will have low enough misfits, in some cases lower than the original solution, to be considered solutions of the problem. The acceptance-rejection criterion for a given model is given by a threshold value for the misfit that can be set for example, as being a fraction (i.e. 10%) larger that the misfit of the original (unperturbed) solution or perhaps estimated by the convergence analysis of the inversion. One alternative is that all the perturbed solutions are retained, but an occurrence probability (weight) is associated with every one of them, e.g. a weight that decays exponentially with increasing data misfit. The set of accepted solutions obtained as a result of the above-described workflow assures a dense sampling of the solution space around the local minimum associated with the original solution.

The procedure may then be repeated for each of the original solutions obtained from independent inversions with different starting models. The combined result is a thorough investigation of the model space and a more complete description of the solution space.

Combining the accepted solutions from different inversions sets the stage for a statistical analysis of the result. An amplitude probability density (PD) for resistivity can be derived along with other statistical quantities like: P10, P50, P90, most probable value, standard deviation, etc. This is illustrated in FIG. 2 for a vertical resistivity profile extracted at the target location, i.e. a single surface location. At this stage, the resistivity results can be directly looked at and interpreted alone, used in an integrated interpretation along with seismic data (or other data if available), or used as an input for a more elaborate rock-physics or petro-physics analysis. A chart of the workflow where the horizontal and vertical resistivities are treated together as one anisotropic solution is presented in FIG. 3.

Although the inventive method was discussed only in the context of a subsurface resistivity analysis mapping, it is possible to extend the applicability of the method to the seismic world as well. Without any modification, the same analysis can be applied to other smooth spatially varying parameters like PSDM or PSTM stacked seismic velocities or density cubes. (It can be applied to either pre- or post-stack migration in the same manner.)

Next, a preferred embodiment of the invention is described, with reference to the numbered steps in the flowchart of FIG. 3. At step 31, a starting resistivity model of the subsurface is obtained. In this instance, there will be two models, one for horizontal resistivity and the other for vertical resistivity. At step 32, electromagnetic data, acquired from the subsurface region, are numerically inverted, using a computer, to infer updated models of horizontal and vertical resistivity. At step 33, principal components (PC's) are calculated for both horizontal and vertical resistivity. Alternatively, a different type of decomposition could be used, for example Fourier transforms (FT) or discrete cosine transform (DCT) instead of a PCA-type decomposition. Deciding which technique to use may be based on how quickly the solution is reconstructed with the addition of subsequent vector components (convergence). Experience has indicated that PCA-type decomposition may be preferable, at least in some controlled source electromagnetic applications. At step 34, the parameterization of the (each) model is reduced. At step 35, the perturbation space is defined. In step 36, a plurality of new models are generated from each resistivity model by perturbing the projection of the model in the perturbation space. For example, if the resistivity is assumed to be anisotropic, with vertical transverse symmetry, then a vertical resistivity model and a horizontal resistivity model are generated. Preferably, but not necessarily, the two models are perturbed simultaneously. In step 37, each of the new models is used to forward-synthesize (performed numerically using a computer programmed to solve Maxwell's equations) electromagnetic field data. For each perturbed model, the misfit is computed for the simulated data relative to the measured data, using a selected objective function to measure the misfit. The new (perturbed) models are parameterized with respect to data misfit, i.e. for each perturbed solution there will be a data misfit associated with it. At step 38, a larger set of new models is generated along with their corresponding misfits from the said new models by means of interpolation. (No additional simulations need be performed.) At step 39, allowed models are identified from the larger set of new models from step 38 based on misfit. At step 40, one or more different starting models may optionally be constructed, and steps 32-39 are repeated for each. The allowed perturbed models for all starting models may be collected at step 41, and from them the resistivity uncertainties and other statistical quantities can be constructed at step 42. For this embodiment, i.e. the embodiment of FIG. 3, steps 33-42 are performed separately for the horizontal and vertical resistivity solutions. Alternatively, as discussed above, the vertical and horizontal resistivity (from step 32) may be treated together, and a joint perturbation performed in the combined perturbation space, which is the direct product of the two individual perturbation spaces constructed at step 35. Then the method may follow through steps 36-39 by treating each pair of horizontal and vertical resistivities as one anisotropic solution.

The foregoing description is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined by the appended claims.

The invention claimed is:

1. A computer-implemented method for quantitatively estimating uncertainty in a model of a subsurface physical property inferred by inversion of measured geophysical data, comprising:

performing, with a computer, a principal component decomposition of the model by transforming the model to a principal component domain, using a computer;

reducing, with a computer, the principal component domain to an N-dimensional reduced domain by selecting N, less than all, principal components, based on a criterion favoring larger principal components over smaller principal components;

defining, with a computer, an D-dimensional perturbation space within the N-dimensional reduced domain, where D<N;

generating, with a computer, perturbed models by perturbing the model within the perturbation space and interpolation within the perturbation space;

applying, with a computer, a statistical analysis technique to the perturbed models to compute the uncertainty in said model inferred by inversion of measured geophysical data, or compute a statistically updated model and associated uncertainty;

performing a computer simulation with the perturbed models, wherein the simulation includes generating simulated geophysical data from the perturbed models, comparing the simulated geophysical data to the measured geophysical data, and transforming a misfit between the simulated geophysical data and the measured geophysical data to an uncertainty in the subsurface property inferred by the inversion of the measured geophysical data; and prospecting for hydrocarbon in a subsurface region, wherein a hydrocarbon exploration decision is based on the subsurface property inferred by the inversion of the measured geophysical data and the uncertainty in the subsurface property.

2. The method of claim 1, further comprising after the generating but before the applying a statistical analysis technique:

forward modeling the perturbed models, using a computer, to generate synthetic geophysical data, and computing misfit between the synthetic geophysical data and the measured geophysical data; and filtering out at least one of the perturbed models based on a selected data misfit threshold, and using remaining perturbed models for the uncertainty computation by statistical analysis.

3. The method of claim 2, wherein the misfit threshold is based on misfit associated with the model in said inversion of measured geophysical data.

4. The method of claim 1, wherein the geophysical data are electromagnetic field data, and the physical property is resistivity or conductivity.

5. The method of claim 4, wherein the method is performed, separately or jointly, for both a horizontal resistivity model and a vertical resistivity model, wherein for a joint uncertainty estimation, a joint perturbation is performed in a combined perturbation space.

6. The method of claim 1, wherein the statistically updated model and associated uncertainty is a most probable model and a standard deviation.

7. The method of claim 1, further comprising performing an additional inversion of the measured geophysical data, resulting in a second inverted model due to inversion non-uniqueness, and performing the method on the second inverted model to generate perturbed models associated with the second inverted model, and then combining perturbed versions of the perturbed models and the perturbed models associated with the second inverted model for the statistical analysis.

8. The method of claim 1, wherein the principal component decomposition is singular value decomposition.

9. The method of claim 1, wherein D<N is achieved by omitting one or more of the N principal components in the reduced domain, or by combining one or more of the N principal components to form a single dimension, or by a combination of both.

10. The method of claim 1, wherein the perturbation space has m+1 principal components and is defined to be 2-dimensional, in which a first dimension is spanned by the principal component having a largest magnitude while a second dimension is given by a subspace of the remaining m principal components.

11. The method of claim 10, wherein m+1=N.

12. The method of claim 1, wherein a 3D window in Cartesian space is used for calculating the principal components or perturbing the model or both.

13. The method of claim 1, wherein D≥2.

* * * * *